(12) United States Patent
Mitani et al.

(10) Patent No.: US 7,052,974 B2
(45) Date of Patent: May 30, 2006

(54) BONDED WAFER AND METHOD OF PRODUCING BONDED WAFER

(75) Inventors: Kiyoshi Mitani, Gunma (JP); Kiyoshi Demizu, Tokyo (JP); Isao Yokokawa, Gunma (JP); Tadahiro Ohmi, Miyagi (JP); Shigetoshi Sugawa, Miyagi (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 10/496,379

(22) PCT Filed: Nov. 25, 2002

(86) PCT No.: PCT/JP02/12277

§ 371 (c)(1),
(2), (4) Date: May 24, 2004

(87) PCT Pub. No.: WO03/049189

PCT Pub. Date: Jun. 12, 2003

(65) Prior Publication Data

US 2005/0003648 A1    Jan. 6, 2005

(30) Foreign Application Priority Data

Dec. 4, 2001    (JP)    ............................. 2001-370680

(51) Int. Cl.
*H01L 21/30* (2006.01)
*H01L 21/46* (2006.01)

(52) U.S. Cl. ...................... 438/459; 438/197; 438/455; 438/475

(58) Field of Classification Search ................ 438/455, 438/459, 458, 977, 106, 197, 301, 474, 475, 438/612
See application file for complete search history.

(56) References Cited

U.S. PATENT DOCUMENTS 6,284,629 B1 * 9/2001 Yokokawa et al. ......... 438/459

(Continued)

FOREIGN PATENT DOCUMENTS

EP    0 977 255 A2    2/2000

(Continued)

OTHER PUBLICATIONS

Takagi, Shin-ichi et al. "On the Universality of Inversion Layer Mobility in Si MOSFET's: Part II- Effects of Surface Orientation." *IEEE Transactions on Electronic Devices*, vol. 41, No. 12, Dec. 1994 (pp. 2363-2368).

(Continued)

*Primary Examiner*—David Nhu
(74) *Attorney, Agent, or Firm*—Oliff & Berridge, PLC

(57) ABSTRACT

The present invention provides a bonded wafer, wherein at least a silicon single crystal layer is formed on a silicon single crystal wafer, the silicon single crystal layer has a crystal plane orientation of {110}, and the silicon single crystal wafer has a crystal plane orientation of {100}. The present invention also provides a method of producing a bonded wafer, wherein after at least a first silicon single crystal wafer having a crystal plane orientation of {110} and a second silicon single crystal wafer having a crystal plane orientation of {100} are bonded directly or bonded via an insulator film, the first silicon single crystal wafer is made into a thin film. Thereby, there can be provided a wafer possible to obtain a MIS device having good characteristics by utilizing a silicon single crystal wafer having the {110} plane.

16 Claims, 3 Drawing Sheets

U.S. PATENT DOCUMENTS

| | | | | |
|---|---|---|---|---|
| 6,306,730 B1 | * | 10/2001 | Mitani et al. | 438/458 |
| 6,372,609 B1 | * | 4/2002 | Aga et al. | 438/459 |
| 6,566,233 B1 | * | 5/2003 | Yokokawa et al. | 438/455 |
| 6,846,718 B1 | * | 1/2005 | Aga et al. | 438/406 |

FOREIGN PATENT DOCUMENTS

| | | |
|---|---|---|
| JP | A 5-090117 | 4/1993 |
| JP | A 2000-331899 | 11/2000 |

OTHER PUBLICATIONS

Hamada, Tatsufumi et al. "Thin Inter-Polyoxide Films for Flash Memories Grown at Low Temperature (400° C.) by Oxygen Radicals." *IEEE Electron Device Letters*, vol. 22, No. 9, Sep. 2001 (pp. 423-425).

Saito, Yugi et al. "Advantage of Radical Oxidation for Improving Reliability of Ultra-Thin Gate Oxide." *2000 Symposium On VLSI Technology Digest of Papers* (pp. 176-177).

* cited by examiner (a)

(b)

BONDED WAFER AND METHOD OF PRODUCING BONDED WAFER

TECHNICAL FIELD

The present invention relates to a bonded wafer using a silicon single crystal wafer and a production method thereof, and more particularly to a bonded wafer suitable for a MIS (MOS) type device.

BACKGROUND ART

A gate insulator film of a MIS (metal/insulator film/silicon) type transistor produced by using a silicon single crystal wafer is required to have high-performance electric properties such as low leakage current characteristics, low interface state density, and high carrier injection resistance, and high reliability. As a technique for forming a gate insulator film (mainly, a silicon oxide film) satisfying these requirements, there has conventionally been utilized a thermal oxidation technique using oxygen molecules or water molecules at 800° C. or higher.

Conventionally, when a silicon wafer having a {100} plane or a silicon wafer having a plane orientation tilting about 4° from a {100} plane is used, there can be obtained good oxide film/silicon interface characteristics, oxide dielectric breakdown voltage characteristic and leakage current characteristic by using the thermal oxidation technique. This is caused by the fact that the interface state of the gate oxide film formed on a {100} plane is lower than the other crystal planes. If a gate oxide film is formed on a silicon wafer having a plane orientation other than that mentioned above by using the thermal oxidation technique, electric properties are degraded, that is, the interface state density of an oxide film/silicon interface becomes high, the oxide dielectric breakdown voltage characteristic and leakage current characteristic are degraded, and so forth.

Therefore, for a silicon wafer on which a MIS type semiconductor device as represented by a so-called MOS (metal/silicon oxide film/silicon) type transistor is formed, a silicon wafer having a {100} plane or a silicon wafer having a plane orientation tilting about 4° from a {100} plane has conventionally been used.

Recently, the technique for forming an insulator film of good quality irrespective of the plane orientation of a silicon wafer surface was developed (see 2000 Symposium ON VLSI Technology, Honolulu, Hi., Jun. 13th–15th, 2000 "Advantage of Radical Oxidation for Improving Reliability of Ultra-Thin Gate Oxide"). Therefore, it can be said that, according to such a technique, it is not necessary to limit the plane orientation of wafers for the production of MIS type semiconductor devices to the {100} plane.

On the other hand, it has been revealed that carrier mobility in the channel direction of MISFET may be twice or more in a certain direction of a wafer having a {110} plane, and thus, current between a source and a drain is increased.

Therefore, it can be conceived that in order to fabricate a MIS device, if a gate insulator film is formed by using a silicon single crystal wafer having a {110} plane with a technique for forming a good insulator film irrespective of the plane orientation as aforementioned, a MIS type device having unprecedented good characteristics can be fabricated.

DISCLOSURE OF THE INVENTION

However, inventors of the present invention found through their experiments that since a silicon single crystal wafer having a {110} plane has an atomic arrangement of uniaxial symmetry (twofold symmetry), the wafer is easily warped by a heat treatment as compared with a silicon single crystal wafer having a {100} plane, which has been conventionally used and has an atomic arrangement of biaxial symmetry (fourfold symmetry), therefore the wafer having a {110} plane is not suitable as it is for a MIS device fabrication process.

Accordingly, an object of the present invention is to provide a wafer and its production method possible to overcome the above structural problems and obtain a MIS device having good characteristics by using a silicon single crystal wafer having a {110} plane.

In order to solve the above problem, the present invention provides a bonded wafer, wherein at least a silicon single crystal layer is bonded on a silicon single crystal wafer, the silicon single crystal layer has a crystal plane orientation of {110}, and the silicon single crystal wafer has a crystal plane orientation of {100}.

In this case, it is possible that the silicon single crystal layer has a crystal plane orientation tilting within 15° from the crystal plane orientation of {110}, and the silicon single crystal wafer has a crystal plane orientation tilting within 15° from the crystal plane orientation of {100}.

And, it is also possible that the bonded wafer has a structure that an insulator film is provided between the silicon single crystal wafer and the silicon single crystal layer.

Moreover, it is more preferable that the silicon single crystal layer has a crystal plane orientation of (110), and a [−110] direction of the (110) plane is parallel or perpendicular to a <110> direction of the silicon single crystal wafer.

The bonded wafer of the present invention is effective in particular when the bonded wafer has a diameter of 200 mm or more.

A method of producing a bonded wafer of the present invention is characterized in that after at least a first silicon single crystal wafer having a crystal plane orientation of {110} and a second silicon single crystal wafer having a crystal plane orientation of {100} are bonded directly or bonded via an insulator film, the first silicon single crystal wafer is made into a thin film.

And, the present invention provides a method of producing a bonded wafer, wherein at least hydrogen ions or rare gas ions are implanted from a surface of a first silicon single crystal wafer to form an ion implanted layer in the first silicon single crystal wafer, and after the first silicon single crystal wafer is bonded to a second silicon single crystal wafer, the first silicon single crystal wafer is delaminated at the ion implanted layer, and wherein a silicon single crystal wafer having a crystal plane orientation of {110} is used as the first silicon single crystal wafer, and a silicon single crystal wafer having a crystal plane orientation of {100} is used as the second silicon single crystal wafer.

In this case, it is preferable that an implantation angle of the ions implanted from the surface of the first silicon single crystal wafer is inclined from a direction perpendicular to the {110} plane.

And, it is possible that after an insulator film is formed on the surface of the first silicon single crystal wafer, the ions can be implanted into the first silicon single crystal wafer through the insulator film. Moreover, it is also possible that after the insulator film is formed on the surface of the second silicon single crystal wafer, the first silicon single crystal wafer and the second silicon single crystal wafer can be bonded via the insulator film.

In this case, it is possible that a wafer having a crystal plane orientation tilting within 15° from the crystal plane orientation of {110} is used as the first silicon single crystal wafer, and a wafer having a crystal plane orientation tilting within 15° from the crystal plane orientation of {100} is used as the second silicon single crystal wafer.

And it is more preferable that a wafer having a crystal plane orientation of (110) is used as the first silicon single crystal wafer, and the first silicon single crystal wafer and the second silicon single crystal wafer are bonded so that a [−110] direction of the (110) plane is parallel or perpendicular to a <110> direction of the second silicon single crystal wafer.

The method of producing a bonded wafer of the present invention is effective in particular when the first silicon single crystal wafer and the second silicon single crystal wafer have a diameter of 200 mm or more.

As explained above, according to the present invention, there can be provided a bonded wafer in which a silicon single crystal layer to be an active layer for fabricating a MOS device and the like is applied to a {110} plane possible to obtain high carrier mobility, and warpage due to a heat treatment is difficult to be generated. Moreover, there is another advantage that the direction in which the mobility of the silicon single crystal layer is increased corresponds to the direction easy to cleave a support substrate, and thereby, the bonded wafer can be easily made into chips.

BEST MODE FOR CARRYING OUT THE INVENTION

Figure 1:
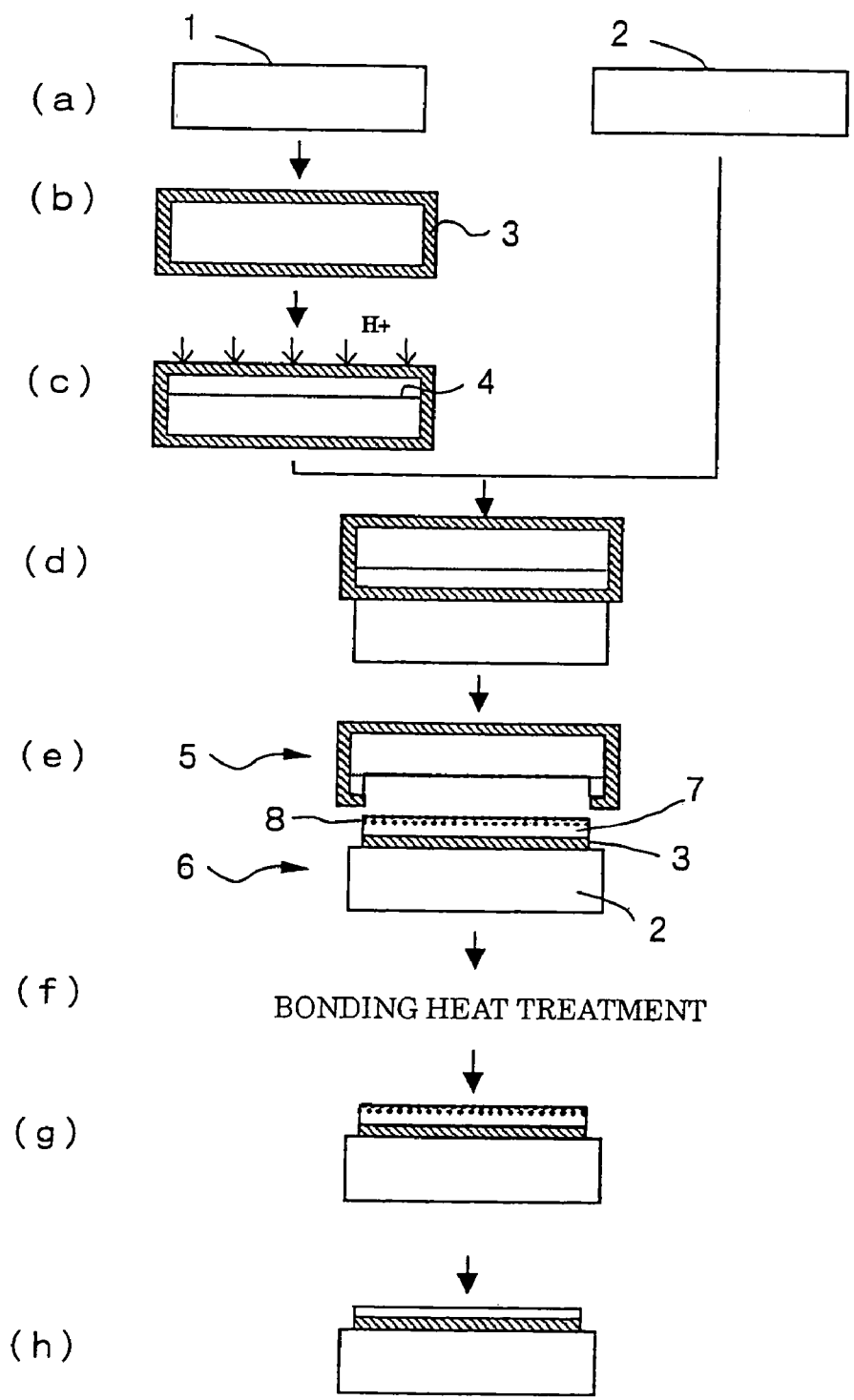
FIG. 1 is a flowchart containing steps of (a)–(h) showing one example of a production process of a bonded wafer of the present invention by an ion implantation method.

Hereinafter, embodiments of the present invention will be explained in detail. However, the present invention is not limited thereto.

As aforementioned, it has been known for a long time that the plane orientation of silicon wafers suitable for forming MIS type devices is {100}, and at that time of finding the above knowledge, silicon wafers only had a small diameter of 4 inches (100 mm) or less. Therefore, after that, even if diameters of silicon wafers have been increased, only silicon wafers having a {100} plane have been exclusively used for MIS type devices, and silicon wafers having a {110} plane have never been used for MIS type devices.

On the other hand, recently, advantages of silicon wafers having a {110} plane for MIS type devices have been appeared, and accordingly, the utility value of silicon wafers having a {110} plane has been increased.

As described above, in view of the facts that a technique for forming a high-quality insulator film irrespective of the plane orientation of a silicon single crystal wafer has been developed and the mobility of a P-channel MISFET is improved twice or more in a certain orientation of a wafer having a {110} plane (as to an N-channel MISFET, it is improved to 40% or more), the inventors of the present invention conceived that the aforementioned insulator film is formed on a silicon single crystal wafer having a {110} plane to produce the MISFET.

Accordingly, silicon single crystal wafers having a {110} plane, which have been hardly produced in a regular mass production line, were produced, and in order to determine MIS device fabrication process conditions, both a silicon single crystal wafer having a {100} plane commonly used and a silicon single crystal wafer having a {110} plane were simultaneously subjected to a heat treatment process, and compared with each other. As a result, as clear from the following experimental results, it became clear that the silicon single crystal wafer having a {110} plane is very easy to be warped as compared with the silicon single crystal wafer having a {100} plane.

<Experimental Conditions>

(Wafers Used Therein)

Silicon single crystal wafers having a {110} plane and a {100} plane, a diameter of 200 mm, and the same standards other than plane orientations were prepared. Each warpage of the silicon single crystal wafers before a heat treatment was 10 μm or less.

(Heat Treatment Conditions)

A horizontal heat treatment furnace, a nitrogen gas atmosphere, 1100° C., 1 hour, and a wafer loading and unloading temperature of 800° C.

<Experimental Results>

The warpage in the wafer having the {100} plane was maintained at 10 μm or less even after the heat treatment. On the other hand, since the wafer having the {110} plane was so warped impossible to be adsorbed with a handling apparatus by backside adsorption, the warpage could not be measured (may be several hundred micrometers or more).

As understood from the above experimental results, it was found that if the {110} silicon wafer is simply produced and used for fabricating MIS type devices, the wafer is extremely warped by a heat treatment in a device fabrication process, and as a result, devices can not be fabricated. This is the first time to appear this fact through the experiment using wafers having a large diameter of 200 mm.

Certainly, silicon wafers having {110} plane had been produced for fabricating various kinds of devices when silicon wafers mainly had a small diameter of 4 inches or less. However, fortunately for the small diameters, the silicon wafers were not so warped by a heat treatment that continuation of a device fabrication process was interfered.

After that, with increase of diameters of silicon wafers possible to be produced as the time proceeds, the mainstream of semiconductor devices are shifted to MIS type devices, and almost all silicon wafers used for integrated circuits have a {100} plane. And silicon wafers having a {110} plane are hardly used other than special usage for some sensors.

From the above circumstances, before the above experiments were performed, it had been utterly unknown that a silicon wafer having a {110} plane and a diameter of 200 mm is greatly warped by such a heat treatment as is performed in a usual MIS device fabrication process, and therefore, devices can not be fabricated thereon. Moreover, in the case that silicon wafers have a large diameter of 300 mm, which will be mainly used in the future, or have a large diameter of over 300 mm, it is to be expected that silicon wafers having a {110} plane orientation are further warped by a heat treatment, which may be a major obstacle to the device fabrication.

Accordingly, on the basis of the above experimental results, the inventors of the present invention conceived that wafers having different plane orientations are bonded to produce a bonded wafer so as to combine an advantage of a MIS device in a silicon single crystal wafer having a {110} plane with an advantage of mechanical strength in a silicon single crystal wafer having a {100} plane, and consequently, they accomplished the present invention.

Hereinafter, the present invention will be explained further in detail by taking a bonded SOI wafer produced by an ion implantation delamination method (also called a smart cut method (registered trademark) for example. However, the present invention is not limited thereto.

FIG. 1 is a flowchart showing one example of a production process of a bonded SOI wafer of the present invention. First, in the step (a), a mirror-polished silicon wafer having a crystal plane orientation of {110} used as a first silicon single crystal wafer 1 to be a silicon single crystal layer on which a device is fabricated is prepared. In this case, it is desirable that the first silicon single crystal wafer 1 has the plane orientation of {110} accurately. However, in terms of improvement of mobility of the MIS device and lowering of the interface state density of a gate insulator film/silicon interface, a margin of about 15° is acceptable, the margin is preferably within 10°, and more preferably within 5°. And a second silicon single crystal wafer 2 is used as a support substrate for supporting the silicon single crystal layer on which a device is fabricated, and if a wafer has a crystal plane orientation of {100}, the wafer is preferable since the wafer has the plane orientation of high usability for various purposes and good resistance to warpage. Also in this case, when the margin of 15°, preferably within 10°, or more preferably within 5° to the {100} plane is satisfied, since resistance to warpage becomes high, warpage due to a heat treatment can be lowered as compared with the wafer having the {110} plane.

Next, in the step (b), a silicon oxide film 3 to be an insulator film (buried oxide layer) of an SOI wafer having a thickness about several dozen nanometers to two micrometers is formed on a surface of at least one wafer (in this case, the first silicon single crystal wafer 1).

In the step (c), hydrogen ions out of hydrogen ions and rare gas ions are implanted in this case from one side of the first silicon single crystal wafer on which the oxide film is formed to form an ion implanted layer (micro bubble layer) 4 parallel to the surface in mean penetration depth of the ions. In this case, since the first silicon single crystal wafer 1 has a plane orientation of {110}, interstices between silicon atoms are large, and the hydrogen ions to be implanted easily suffer from channeling. As a result, there is a problem that a concentration distribution of the hydrogen ion implanted layer is being broad along the depth direction, and delamination does not smoothly occur in a subsequent delamination process. In the production flowchart shown in FIG. 1, since the oxide film is formed on the surface into which hydrogen ions are implanted, the aforementioned channeling phenomenon is suppressed. Therefore, an angle of implanting hydrogen ions may be possible to be perpendicular to a {110} plane. However, when hydrogen ions are implanted from the surface on which an oxide film is not formed, it is preferable that hydrogen ions are implanted so that the implantation angle is inclined from a direction perpendicular to a {110} plane. The angle to be inclined is preferably about 3-20°. Even when the oxide film is formed on the surface from which hydrogen ions are implanted, by implanting hydrogen ions at an angle inclined from a direction perpendicular to a {110} plane, the channeling can also be further suppressed.

The step (d) is a step of superposing and bonding the second silicon single crystal wafer 2 onto the hydrogen ion implanted surface of the first silicon single crystal wafer 1 via the silicon oxide film. By contacting the surfaces of the two wafers to each other in a clean atmosphere at an ordinary temperature, the wafers are adhered to each other without an adhesive or the like.

Figure 2:
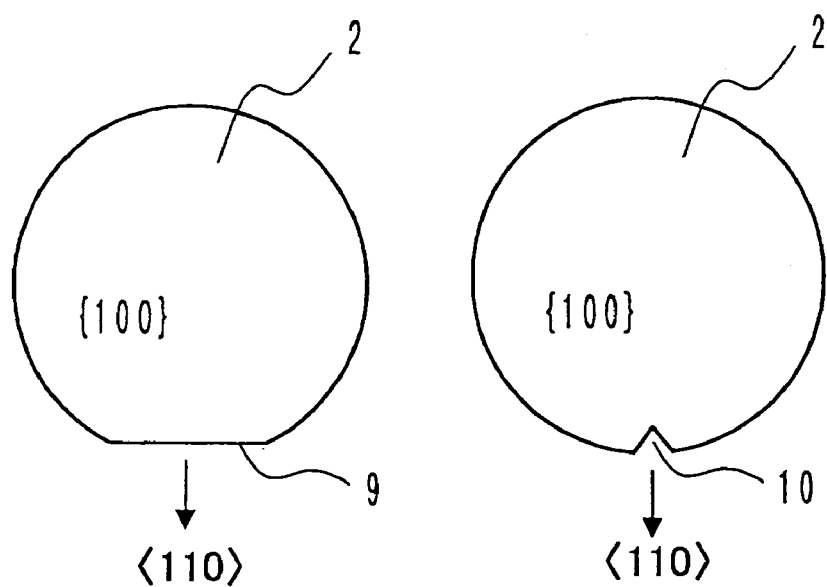
FIG. 2 illustrates crystal plane orientations, and orientations of an orientation flat and a notch in the second silicon single crystal wafers used in the present invention.
Figure 3:
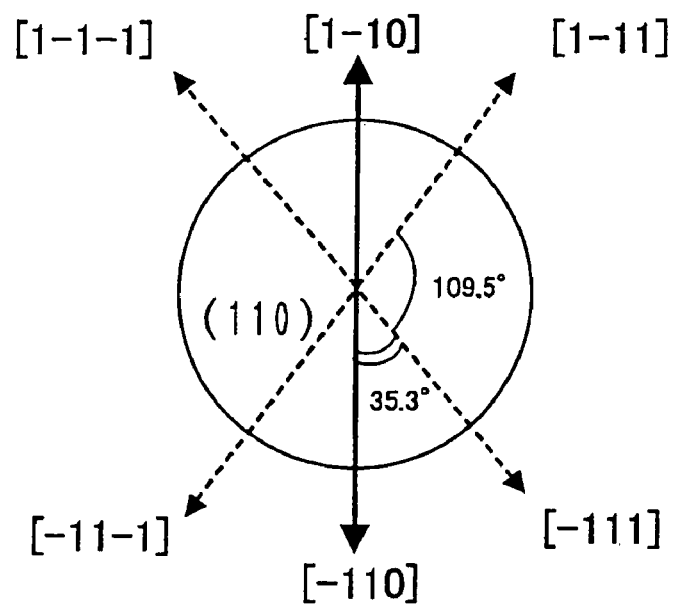
FIG. 3 shows a crystal plane orientation of the first silicon single crystal wafer and orientations possible to obtain high mobility.

In this case, a wafer having a crystal plane orientation of {100} and an orientation of an orientation flat (or notch) of <110> is used as the second silicon single crystal wafer (see FIG. 2), when the first silicon single crystal wafer is bonded to the second silicon single crystal wafer so that the direction in which the mobility of the first silicon single crystal wafer is increased ([−110] direction or [1−10] direction parallel to the [−110] direction when the first silicon single crystal wafer has a plane orientation of (110): see FIG. 3) corresponds to the direction parallel or perpendicular to the orientation of <110>, a source drain direction of a MIS type transistor formed on a silicon single crystal layer 7 (SOI layer) corresponds to the <110> direction, and thereby, the channel mobility can be easily improved. Moreover, when the completed bonded wafer is made into chips, thanks to easiness of cleaving in the <110> direction of the second silicon single crystal wafer, there can be obtained an additional advantage that the bonded wafer can be easily made into chips.

Next, the step (e) is a delaminating heat treatment step in which the bonded wafer is delaminated at an ion-implanted layer 4 as a border to separate into a delaminated wafer 5 and an SOI wafer 6 (the silicon single crystal layer 7 (SOI layer)+buried oxide film 3+second silicon single crystal wafer 2). For example, by a heat treatment under an inert gas atmosphere about 400–600° C., the bonded wafer is separated into the delaminated wafer 5 and the SOI wafer 6 due to rearrangement of crystals and agglomeration of bubbles. And a damage layer 8 remains on the SOI layer 7 formed on the surface of the SOI wafer 6 being delaminated. In addition, there may be the case that a hydrogen ion implantation dose is extremely increased or a bonding strength is increased by surface treatment of the surface to be bonded in the bonding step at a room temperature (a plasma treatment), so that mechanical delamination becomes possible, and therefore, the delaminating heat treatment in the step (e) may not necessarily be needed.

After this delamination process, a bonding heat treatment process is performed in the step (f). In this step, the SOI wafer 6 is subjected to a heat treatment at a high temperature as a bonding heat treatment to obtain sufficient bonding strength, since the bonding strength of the bonded wafer brought into close contact with each other in the steps (d) and (e) of the aforementioned bonding step and the delaminating heat treatment step would be weak for use in the device production process. This heat treatment is preferably performed, for example, under an inert gas atmosphere at 1000–1300° C. for 30 minutes to 2 hours. Also, by performing the delaminating heat treatment in the step (e) at a high temperature, the bonding heat treatment step (f) can be omitted.

Next, in the step (g), surface roughness of the SOI surface is improved and damages thereon are eliminated. Usually, a polishing process, called a touch polish, (its stock removal is 100 nm or less) is performed. However, as a substitute for the polishing process, a high temperature annealing under an argon gas or hydrogen gas atmosphere can be performed. Also, damages can also be eliminated by a so-called sacrificial oxidation treatment that after thermal oxidation is performed, the resultant oxide film is eliminated, or these steps may be combined properly.

Through the above steps, the bonded wafer of the present invention can be obtained.

Hereinafter, the present invention will be explained in detail by citing Example and Comparative Example. However, the present invention is not limited thereto.

EXAMPLE

Figure 4:
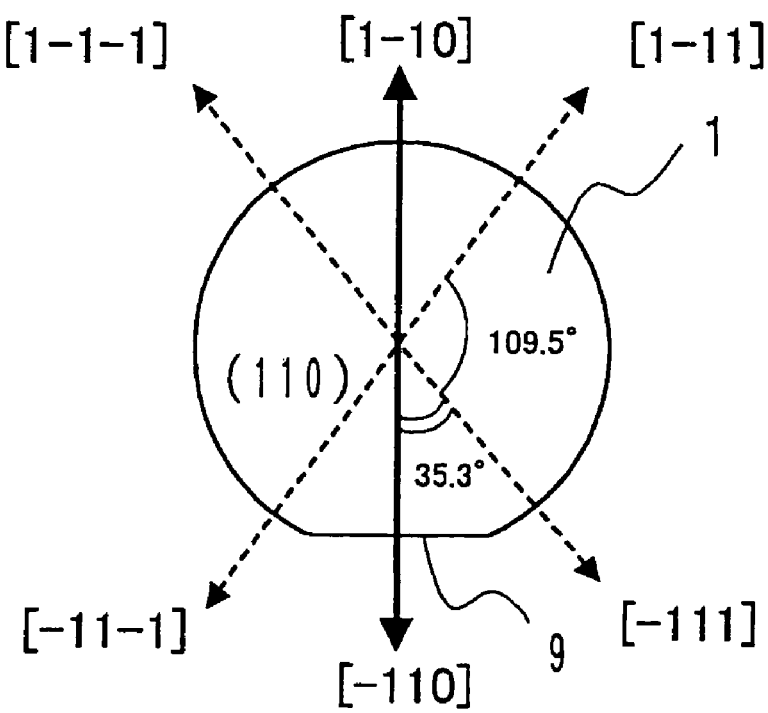
FIG. 4 show each plane orientation and each orientation of orientation flats of the first and second silicon single crystal wafers used in Example.
Figure 4:
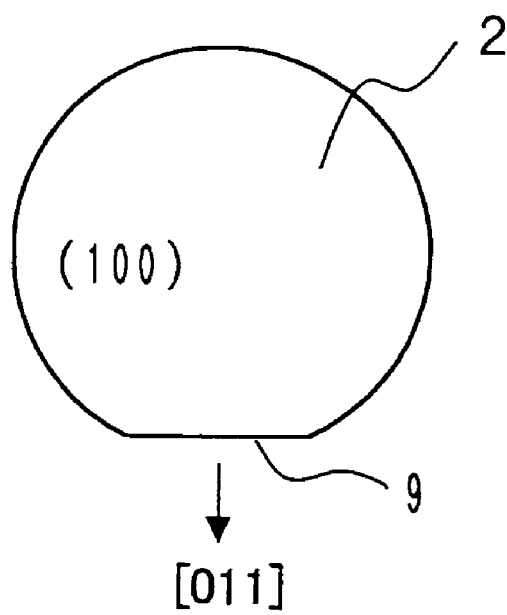

A silicon single crystal ingot produced by a Czochralski method and having a crystal orientation of <110>, a conductivity type of P-type, and a resistivity of about 10 Ω·cm was sliced to produce a silicon single crystal wafer having a diameter of 200 mm and a crystal plane orientation of (110) (the margin of the plane orientation was 1° or less), which was used as a first silicon single crystal wafer (to be an SOI layer). In addition, an orientation flat was formed in a direction of [−110] on the (110) plane of the first silicon single crystal wafer (see FIG. 4(a)).

And, a silicon single crystal ingot produced by a Czochralski method and having a crystal orientation of <100>, a conductivity type of P-type, and a resistivity of about 10 Ω·cm was sliced to produce a silicon single crystal wafer having a diameter of 200 mm and a crystal plane orientation of (100) (the margin of the plane orientation was 1° or less), which was used as a second silicon single crystal wafer (a support substrate). In addition, an orientation flat was formed in a direction of [011] thereof (see FIG. 4(b)).

These wafers were processed by an ion implantation delamination method in accordance with steps shown in FIGS. 1(a)–(h) to produce an SOI wafer.

First, in accordance with the steps (a)–(e) shown in FIG. 1, by delaminating the first silicon single crystal wafer 1, an SOT wafer 6 was obtained.

In that case, a buried oxide film 3 had a thickness of 400 nm, and the other main conditions such as ion implantation were as follows:
1) Ion implantation conditions: $H^+$ ions, implantation energy of 80 keV, implantation dose of $6.5 \times 10^{16}/cm^2$. Ions were implanted from a direction tilting about 7° from a direction perpendicular to a (110) plane.
2) Delamination heat treatment conditions: under $N_2$ gas atmosphere, 500° C., 30 minutes.

Thus, the SOI wafer 6 having an SOI layer 7 with a thickness of about 300 nm could be obtained.

Next, the SOI wafer 6 was subjected to a bonding heat treatment under an oxidizing atmosphere at 1100° C. for 2 hours. After an oxide film formed on the SOI surface was eliminated with a hydrofluoric acid, the SOI surface was polished about 100 nm so as to completely eliminate damages therefrom and improve surface roughness, and thereby, a bonded SOI wafer having the SOI layer with a thickness of about 100 nm was completed.

Since the SOI layer on the bonded SOI wafer completed had the crystal plane orientation of (110), but the support substrate had the crystal plane orientation of (100), mechanical strength of the bonded SOI wafer (resistance to warpage due to heat treatment) was obtained at the equal level as a usual (100) wafer. And, since the wafers were bonded so that each orientation flat of the wafers corresponded to each other when bonding the wafers, the direction easy to cleave a support substrate corresponded to the direction in which high carrier mobility was obtained when fabricating a MIS device on the SOI layer, and thereby, the bonded SOI wafer was easily processed into rectangular chips, and its processing loss could be lowered. It was confirmed that these effects were also obtained from the bonded SOI wafer produced by using a wafer having a plane orientation tilting 5–15° from the (110) plane as a first silicon single crystal wafer and using a wafer having a plane orientation tilting 5–15° from the (100) plane as a second silicon single crystal wafer.

The present invention is not limited to the embodiments described above. The above-described embodiments are mere examples, and those having the substantially same structure as that described in the appended claims and providing the similar functions and advantages are included in the scope of the present invention.

For example, the case where the bonded wafer is produced by an ion implantation delamination method is mainly explained in the aforementioned embodiments, the present invention is not limited thereto and can employ a method that, for example, after two wafers are bonded, one wafer is ground and polished to be made into a thin film or a method that a porous layer is formed on a surface of one wafer, an epitaxial layer is formed on the porous layer, a surface of the epitaxial layer is bonded to a surface of the other wafer, and the resultant wafer is delaminated at the porous layer.

Also, in the above Example, the wafer having a (110) plane is used as the first silicon single crystal wafer, and the orientation flat is formed in the [−110] direction thereof. However, it goes without saying that the same effects as in the Example can be obtained when a wafer having an equivalent plane orientation to the (110) wafer, which is not the (110) wafer as it is, and having an orientation flat formed in a direction of the wafer having an equivalent relation to a [−110] direction for the (110) plane is used.

Moreover, the case that the bonded wafer having a diameter of 200 mm is produced is explained by way of examples. However, the present invention is not limited thereto, and in particular, since wafers will be more warped easily than before when diameters of the wafers are reached to 300 mm or more in the future, it is more effective to apply the present invention to the bonded wafers.

The invention claimed is:

1. A method of producing a bonded wafer, wherein after at least a first silicon single crystal wafer having a crystal plane orientation of {110} or a crystal plane orientation tilting within 15° from the crystal plane orientation of {110}, and a second silicon single crystal wafer having a crystal plane orientation of {100} or a crystal plane orientation tilting within 15° from the crystal plane orientation of {100), are bonded directly or bonded via an insulator film, the first silicon single crystal wafer is made into a thin film.

2. A method of producing a bonded wafer, wherein after at least hydrogen ions or rare gas ions are implanted from a surface of a first silicon single crystal wafer to form an ion implanted layer in the first silicon single crystal wafer, and after the first silicon single crystal wafer is bonded to a second silicon single crystal wafer, the first silicon single crystal wafer is delaminated at the ion implanted layer, and wherein a silicon single crystal wafer having a crystal plane orientation of {110} or a crystal plane orientation tilting within 15° from the crystal plane orientation of {110}, is used as the first silicon single crystal wafer, and a silicon single crystal wafer having a crystal plane orientation of {100} or a crystal plane orientation tilting within 15° from the crystal plane orientation of {100), is used as the second silicon single crystal wafer.

3. The method of producing a bonded wafer according to claim 2, wherein an implantation angle of the ions implanted from the surface of the first silicon single crystal wafer is inclined from a direction perpendicular to the {110} plane.

4. The method of producing a bonded wafer according to claim 2, wherein after an insulator film is formed on the surface of the first silicon single crystal wafer, the ions are implanted into the first silicon single crystal wafer through the insulator film.

5. The method of producing a bonded wafer according to claim 3, wherein after an insulator film is formed on the surface of the first silicon single crystal wafer, the ions are implanted into the first silicon single crystal wafer through the insulator film.

6. The method of producing a bonded wafer according to claim 2, wherein after an insulator film is formed on the surface of the second single crystal wafer, the second silicon single crystal wafer is bonded to the first silicon single crystal wafer via the insulator film.

7. The method of producing a bonded wafer according to claim 4, wherein a wafer having a crystal plane orientation tilting within 15' from the crystal plane orientation of {110} is used as the first silicon single crystal wafer, and a wafer having a crystal plane orientation tilting within 15° from the crystal plane orientation of {100} is used as the second silicon single crystal wafer.

8. The method of producing a bonded wafer according to claim 1, wherein a wafer having a crystal plane orientation of (110) is used as the first silicon single crystal wafer, and the first silicon single crystal wafer and the second silicon single crystal wafer are bonded so that a [−110] direction of the (110) plane is parallel or perpendicular to a <110> direction of the second silicon single crystal wafer.

9. The method of producing a bonded wafer according to claim 2, wherein a wafer having a crystal plane orientation of (110) is used as the first silicon single crystal wafer, and the first silicon single crystal wafer and the second silicon single crystal wafer are bonded so that a [−110] direction of the (110) plane is parallel or perpendicular to a <110> direction of the second silicon single crystal wafer.

10. The method of producing a bonded wafer according to claim 4, wherein a wafer having a crystal plane orientation of (110) is used as the first silicon single crystal wafer, and the first silicon single crystal wafer and the second silicon single crystal wafer are bonded so that a [−110] direction of the (110) plane is parallel or perpendicular to a <110> direction of the second silicon single crystal wafer.

11. The method of producing a bonded wafer according to claim 5, wherein a wafer having a crystal plane orientation of (110) is used as the first silicon single crystal wafer, and the first silicon single crystal wafer and the second silicon single crystal wafer are bonded so that a [−110] direction of the (110) plane is parallel or perpendicular to a <110> direction of the second silicon single crystal wafer.

12. The method of producing a bonded wafer according to claim 1, wherein each wafer used for the first silicon single crystal wafer and the second silicon single crystal wafer has a diameter of 200 mm or more.

13. The method of producing a bonded wafer according to claim 2, wherein each wafer used for the first silicon single crystal wafer and the second silicon single crystal wafer has a diameter of 200 mm or more.

14. The method of producing a bonded wafer according to claim 4, wherein each wafer used for the first silicon single crystal wafer and the second silicon single crystal wafer has a diameter of 200 mm or more.

15. The method of producing a bonded wafer according to claim 5, wherein each wafer used for the first silicon single crystal wafer and the second silicon single crystal wafer has a diameter of 200 mm or more.

16. The method of producing a bonded wafer according to claim 11, wherein each wafer used for the first silicon single crystal wafer and the second silicon single crystal wafer has a diameter of 200 mm or more.

* * * * *